(12) United States Patent
Tseng et al.

(10) Patent No.: US 7,745,847 B2
(45) Date of Patent: Jun. 29, 2010

(54) METAL OXIDE SEMICONDUCTOR TRANSISTOR

(75) Inventors: Chu-Yin Tseng, Tainan County (TW);
Shih-Chieh Hsu, Hsinchu (TW);
Chih-Chiang Wu, Taichung County (TW); Shyh-Fann Ting, Tai-Nan (TW);
Po-Lun Cheng, Kao-Hsiung Hsien (TW); Hsuan-Hsu Chen, Tai-Nan (TW)

(73) Assignee: United Microelectronics Corp., Hsin-Chu (TW)

( * ) Notice: Subject to any disclaimer, the term of this patent is extended or adjusted under 35 U.S.C. 154(b) by 306 days.

(21) Appl. No.: 11/836,772

(22) Filed: Aug. 9, 2007

(65) Prior Publication Data

US 2009/0039389 A1    Feb. 12, 2009

(51) Int. Cl.
*H01L 31/072*    (2006.01)
*H01L 31/109*    (2006.01)
*H01L 31/0328*   (2006.01)
*H01L 31/0336*   (2006.01)

(52) U.S. Cl. .................. 257/190; 438/218; 438/285

(58) Field of Classification Search .............. 257/19, 257/190, 192, 197; 438/218, 285
See application file for complete search history.

(56) References Cited

U.S. PATENT DOCUMENTS

| | | | |
|---|---|---|---|
| 6,110,787 A * | 8/2000 | Chan et al. ................ 438/300 |
| 6,429,084 B1 * | 8/2002 | Park et al. ................ 438/305 |
| 6,774,000 B2 * | 8/2004 | Natzle et al. ............. 438/300 |
| 6,815,770 B1 * | 11/2004 | Chien et al. .............. 257/344 |
| 7,195,985 B2 * | 3/2007 | Murthy et al. ............ 438/341 |
| 2005/0156154 A1 * | 7/2005 | Zhu et al. .................. 257/19 |
| 2006/0211245 A1 * | 9/2006 | Maszara ................... 438/683 |
| 2007/0298558 A1 * | 12/2007 | Yamauchi et al. ......... 438/197 |
| 2008/0006818 A1 * | 1/2008 | Luo et al. .................. 257/19 |
| 2008/0032468 A1 * | 2/2008 | Cheng et al. ............. 438/197 |
| 2008/0179636 A1 * | 7/2008 | Chidambarrao et al. ... 257/255 |

* cited by examiner

*Primary Examiner*—Phuc T Dang
(74) *Attorney, Agent, or Firm*—Winston Hsu

(57) ABSTRACT

The present invention provides a method for fabricating a metal oxide semiconductor transistor. First, a semiconductor substrate is provided and at least a gate is formed on the semiconductor substrate. A protective layer is then formed on the semiconductor substrate and the gate. Subsequently, at least a recess is formed in the semiconductor substrate adjacent to the gate, and then an epitaxial layer is formed in the recess. A lightly doped region is formed in the semiconductor substrate adjacent to the gate. Finally, a spacer is formed on the sidewall of the gate.

11 Claims, 14 Drawing Sheets

METAL OXIDE SEMICONDUCTOR TRANSISTOR

BACKGROUND OF THE INVENTION

1. Field of the Invention

The present invention relates to a method for fabricating a metal oxide semiconductor (MOS) transistor, and more particularly, to a method for fabricating a strained silicon channel MOS transistor.

2. Description of the Prior Art

A conventional MOS transistor generally includes a semiconductor substrate, such as silicon, a source region, a drain region, a channel positioned between the source region and the drain region, and a gate located above the channel. The gate composed of a gate dielectric layer, a gate conductive layer positioned on the gate dielectric layer, and spacers positioned on the sidewalls of the gate conductive layer. Generally, for a given electric field across the channel of a MOS transistor, the amount of current that flows through the channel is directly proportional to a mobility of the carriers in the channel. Therefore, how to improve the carrier mobility so as to increase the speed performance of MOS transistors has become a major topic for study in the semiconductor field.

One way to increase the mobility of the carriers in the channel of an MOS transistor is to produce a mechanical stress in the channel. A compressive strained channel, such as a silicon germanium (SiGe) channel layer grown on silicon, has significant hole mobility enhancement. A tensile strained channel, such as a thin silicon channel layer grown on silicon germanium, achieves significant electron mobility enhancement. Another prior art method of obtaining a strained channel is to epitaxially grow a SiGe layer adjacent to the spacers within the semiconductor substrate after forming the spacer.

In this type of MOS transistor, a biaxial tensile strain occurs in the epitaxial silicon layer due to the silicon germanium, which has a larger lattice constant than silicon, and, as a result, the band structure alters, and the carrier mobility increases. This enhances the speed performance of the MOS transistor.

The performance of MOS transistors has increased year after year with the diminution of critical dimensions and the advance of very large scale integrated circuits (VLSI); therefore, the demand for the speed performance of the MOS transistor has also greatly increased. However, the compressive or tensile stress obtained according to the conventional method has been hardly achieved the required extent.

Accordingly, the applicants provide a method of fabricating strained silicon channel MOS transistors to improve the shortages from the prior art, and then increase the carrier mobility of MOS transistors.

SUMMARY OF THE INVENTION

The present invention relates to a method of fabricating a MOS transistor, and more particularly, to a method of fabricating a strained silicon channel MOS transistor to improve the disadvantages of the prior art.

According to the claims, the present invention provides a method of fabricating a MOS transistor, the method comprising providing a semiconductor substrate; forming at least a gate on the semiconductor substrate; forming a protective layer on the semiconductor substrate, and the protective layer covering the surface of the gate; forming at least a recess within the semiconductor substrate adjacent to the gate; forming an epitaxial layer in the recess; forming a lightly doped region within the semiconductor substrate adjacent to the gate; and forming a spacer on the sidewall of the gate.

According to the claims, the present invention provides another method for fabricating a CMOS transistor, the method comprising providing a semiconductor substrate having at least a first conductive transistor area for fabricating first conductive transistors and at least a second conductive transistor area for fabricating second conductive transistors, and an isolation structure between the first conductive transistor area and the second conductive transistor area; forming a gate on the first conductive transistor area and on the second conductive transistor area respectively; forming a first protective layer on the semiconductor substrate, and the first protective layer covering the surface of each gate; forming at least a first recess within the semiconductor substrate adjacent to the gate in the first conductive transistor area; forming a first epitaxial layer in the recess; forming a first ion lightly doped region within the semiconductor substrate adjacent to the gate in the first conductive transistor area; and forming a spacer on the sidewall of each gate.

According to the claims, the present invention further provides a MOS transistor structure, the structure comprising a gate formed on a semiconductor substrate; two raised epitaxial layers positioned respectively in the semiconductor substrate next to the relative sides of the gate; a spacer formed on the sidewall of the gate and extending laterally upon a portion of the raised epitaxial layer; and two doped region formed respectively in the semiconductor substrate next to the relative sides of the gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
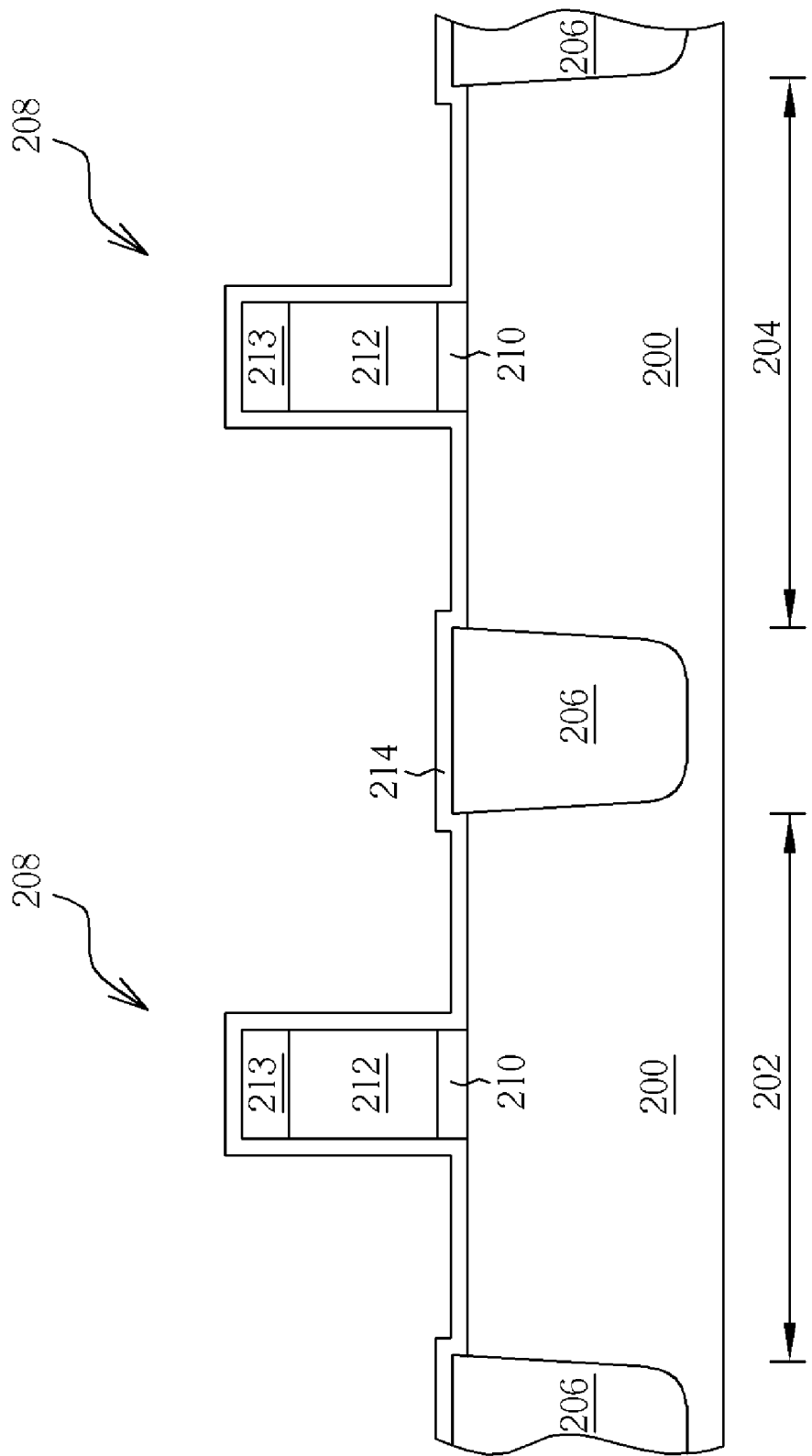
FIG. 1 to FIG. 5 are cross-sectional diagrams, illustrating a fabricating method of MOS transistors in accordance with the first preferred embodiment of the present invention.

Please refer to FIG. 1 to FIG. 5, which are cross-sectional diagrams illustrating a method for fabricating a MOS transistor in accordance with the first preferred embodiment of the present invention. For highlighting the characteristic of the present invention and for clarity of illustration, FIG. 1 to FIG. 5 merely show a first conductive transistor area and a second conductive transistor area. As shown in FIG. 1, a semiconductor substrate 200 is provided such as a silicon substrate or a silicon-on-insulator (SOI) substrate, but not limited thereto. The semiconductor substrate 200 comprises a plurality of first conductive transistor areas 202 and a plurality of second conductive transistor areas 204, and the first conductive transistor areas 202 and the second conductive transistor areas 204 are isolated by isolation structures such as shallow trench isolations (STI) 206. Generally speaking, the STI 206 is formed by etching a trench in the semiconductor substrate 200 and then filling the trench with insulating materials such as silicon oxide. Besides, the semiconductor substrate 200 further comprises a plurality of gates 208, positioned respectively on each first conductive transistor area 202 and each second conductive transistor area 204. Each gate 208 comprises a dielectric layer 210, a conductive layer 212 positioned on the dielectric layer 210 and a cap layer 213 positioned on the conductive layer 212. In general, the dielectric layer 210 comprises isolating materials such as silicon oxide components or silicon nitride components, etc; the conductive layer 212 comprises conductive materials such as polysilicon or metal silicide; and the cap layer 213 comprises dielectric materials such as silicon nitride.

Subsequently, a protective layer 214 is formed on the semiconductor substrate 200, and the protective layer 214 covers the surface of each gate 208. According to the first preferred embodiment of the present invention, the protective layer 214 may comprise any materials with an appropriate etching selectivity to the semiconductor substrate 200 and the conductive layer 212: silicon nitride component, for instance, but not limited thereto. Silicon oxide component may also be used, but the effect of using silicon nitride is better. The protective layer 214 has a thickness of about 150 to 250 Å, and is preferably about 200 Å.

Figure 2:
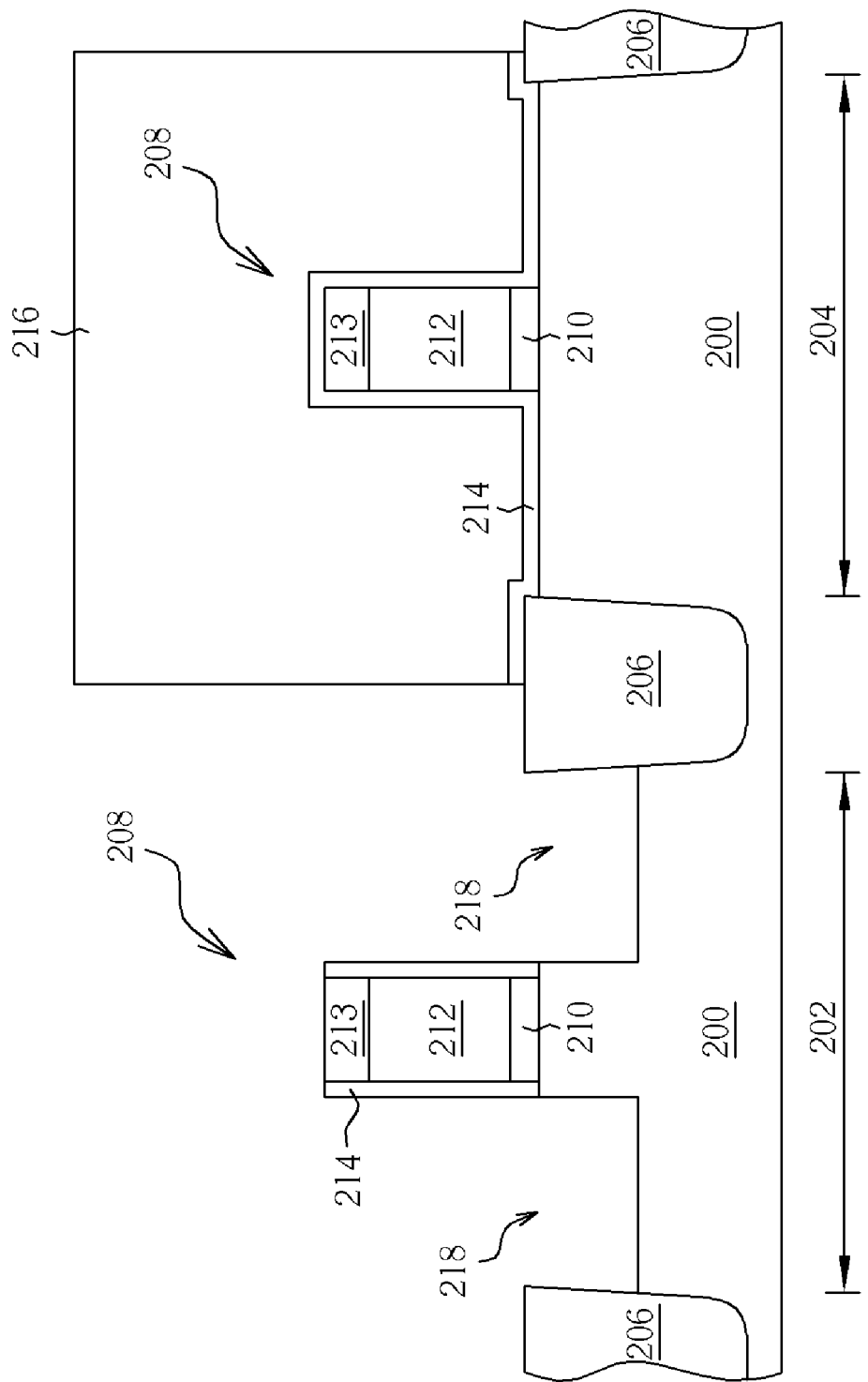

As shown in FIG. 2, a patterned mask 216 is coated on the second conductive transistor area 204 and a portion of the STI 206. An etching process such as an anisotropic dry etching is then carried out to etch recesses 218 in the first conductive transistor area 202. Thereafter, the patterned mask 216 is removed.

Figure 3:
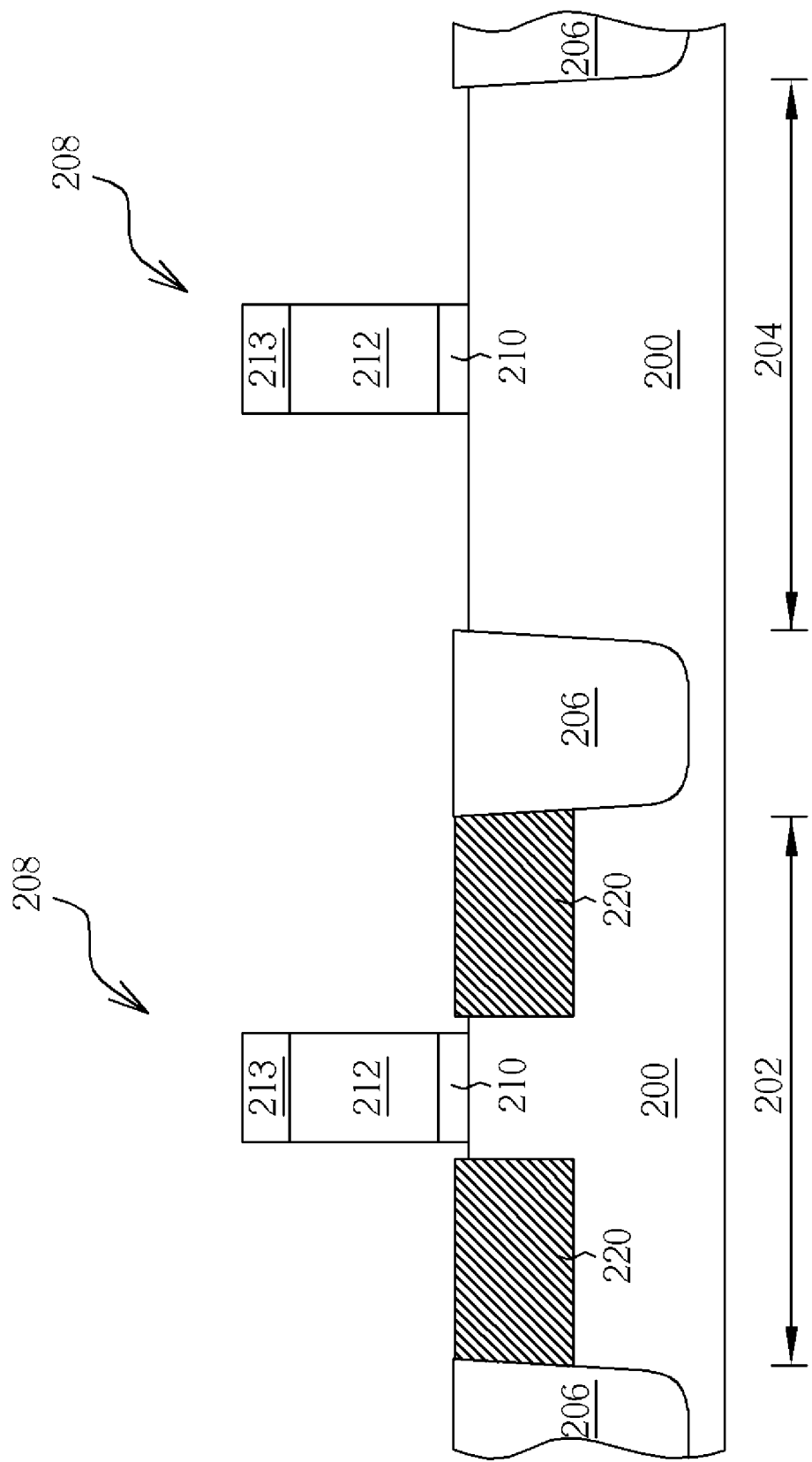

As shown in FIG. 3, after a pre-cleaning step is performed to clean the semiconductor substrate 200 of the first conductive transistor area 202, such as using DHF solution or SPM solution to remove impurities upon the surface of the recesses 218, an epitaxial growth process is carried out to form epitaxial layers 220 in the recesses 218. Then, the protective layer 214 is removed. The epitaxial layer 220 is grown in the recess 218 and it may be grown higher than the surface of the semiconductor substrate 200, so as to form a raised epitaxial layer 220. Besides, the epitaxial growth process may be an in-situ doped ion epitaxial growth process. According to the first preferred embodiment of the present invention, when the first conductive transistor area 202 is a PMOS transistor area, the epitaxial layer 220 is composed of SiGe. And when the first conductive transistor area 202 is an NMOS transistor, the epitaxial layer 220 is composed of SiC.

Figure 4:
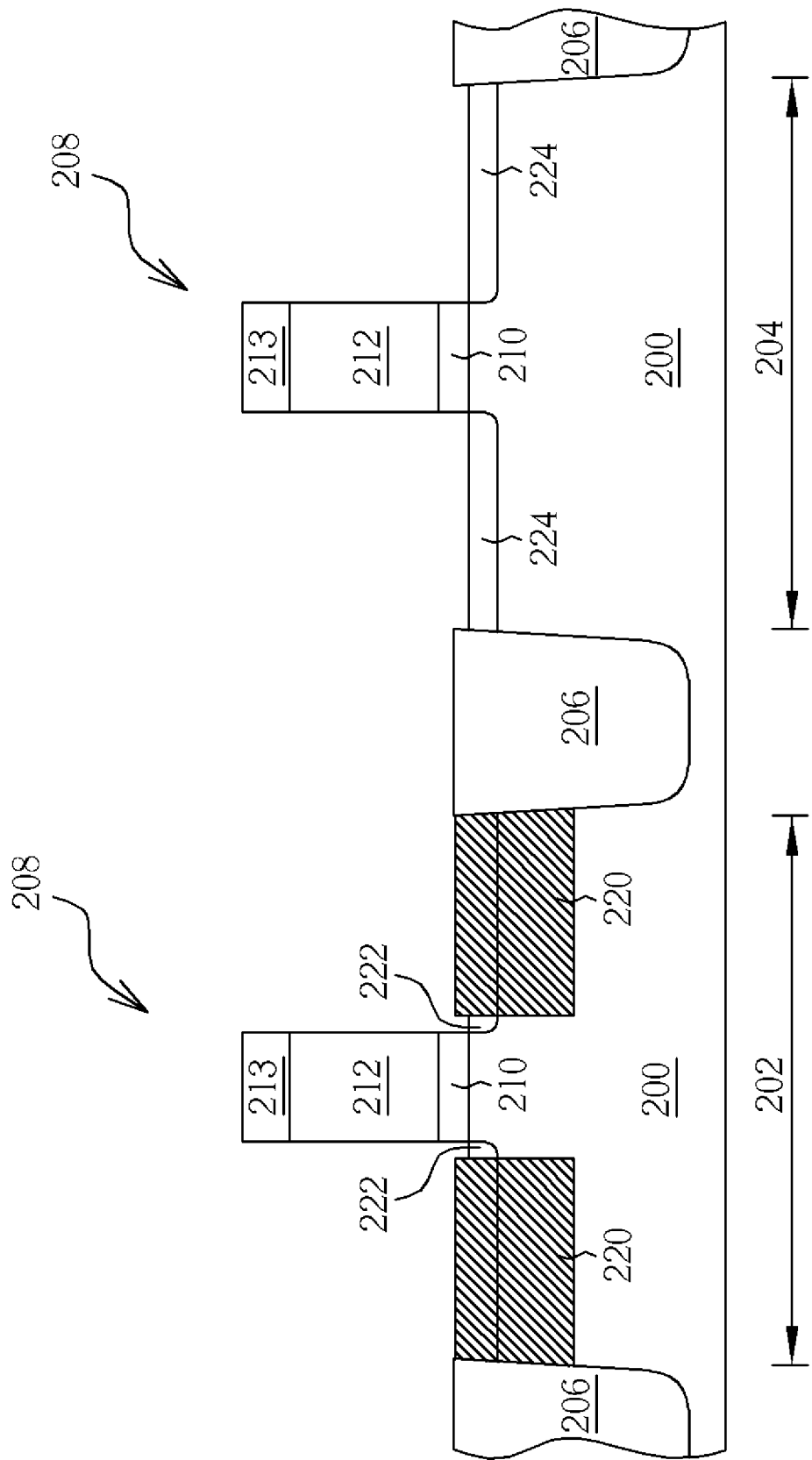

As shown in FIG. 4, a patterned mask (not shown) is coated on the second conductive transistor area 204. A first ion lightly doped process is carried out to form a first ion lightly doped region 222 in the first conductive transistor area 202. Then the patterned mask is removed. Thereafter, another patterned mask (not shown) is coated on the first conductive transistor area 202. A second ion lightly doped process is then carried out to form a second ion lightly doped region 224 in the second conductive transistor area 204. Then the patterned mask is removed.

Figure 5:
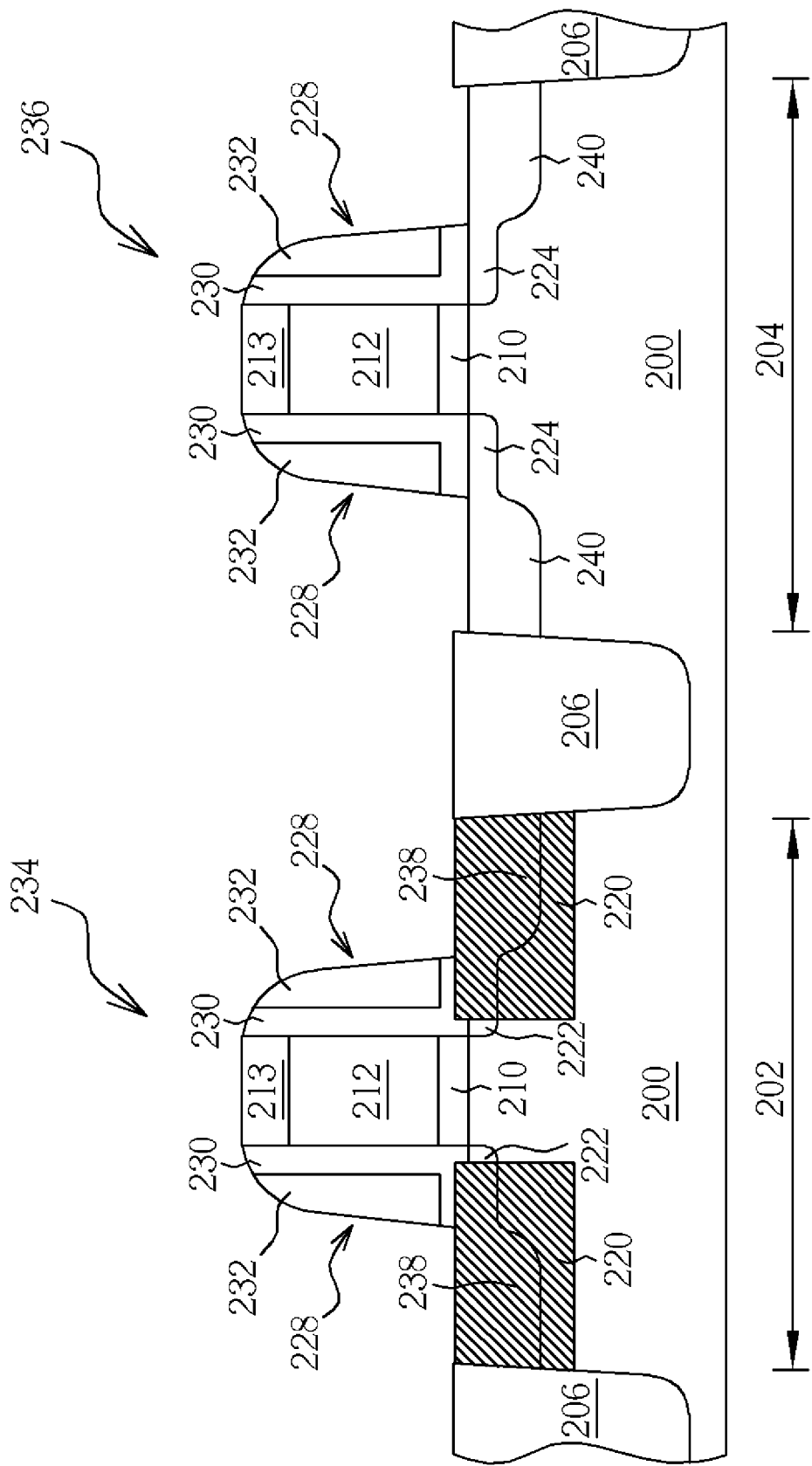
Figure 6:
FIG. 6 shows a transmission electron microscopy picture of MOS transistors in accordance with the first preferred embodiment of the present invention.

As shown in FIG. 5, spacers 228 are formed on the sidewalls of each gate 280. According to the first preferred embodiment of the present invention, each spacer 228 comprises an oxide liner 230 and a nitride spacer 232. The spacers 228 cover the sidewalls of each gate 208 and also extend laterally onto the first ion lightly doped region 222 and the second ion lightly doped region 224. Each spacer 228 may also comprise an offset spacer (not shown) positioned between the gate 208 and the oxide liner 230. Because each spacer 228 in the first conductive transistor area 202 lies over the raised epitaxial layer 220, thus each spacer 228 in the first conductive transistor area 202 is tilted upward. Please refer to FIG. 10, which is a transmission electron microscopy (TEM) picture of the MOS transistors in accordance with the first preferred embodiment of the present invention.

Finally, a patterned mask (not shown) is coated on the second conductive transistor area 204. A first ion source/drain implantation process is then carried out to form a first ion source/drain region 238 in the first conductive transistor area 202; thereby a first conductive transistor 234 such as a PMOS transistor is formed in the first conductive transistor area 202. Thereafter, the patterned mask is removed. Subsequently, another patterned mask (not shown) is coated on the first conductive transistor area 202. A second ion source/drain implantation process is carried out to form a second ion source/drain region 240 in the second conductive transistor area 204; thereby a second conductive transistor 236 such as an NMOS transistor is formed in the second conductive transistor area 204. Thereafter, the patterned mask is removed.

It should be noticed that the process of forming the source/drain regions 238 as shown in FIG. 5 is an optional step depending on the method used in the epitaxial growth process. Because the epitaxial growth process as shown in FIG. 3 may be an in-situ doped epitaxial growth process, therefore, while the epitaxial layer 200 is formed, the demanded doped ions can also be implanted into the semiconductor substrate 200 or the grown epitaxial layer 200, as a result, the corresponding source/drain regions are formed. Thus, the source/drain implantation process as shown in FIG. 5 can be skipped. According to the first preferred embodiment of the present invention, when the first conductive transistor area 202 is a PMOS transistor area, the epitaxial growth process, which is carried out to form the epitaxial layer 220 composed of silicon germanium, may be an in-situ doped boron epitaxial growth process. Accordingly, the corresponding source/drain regions are formed by implanting the demanded boron ions within the semiconductor substrate 200 while the epitaxial layer 220 is formed.

Figure 7:
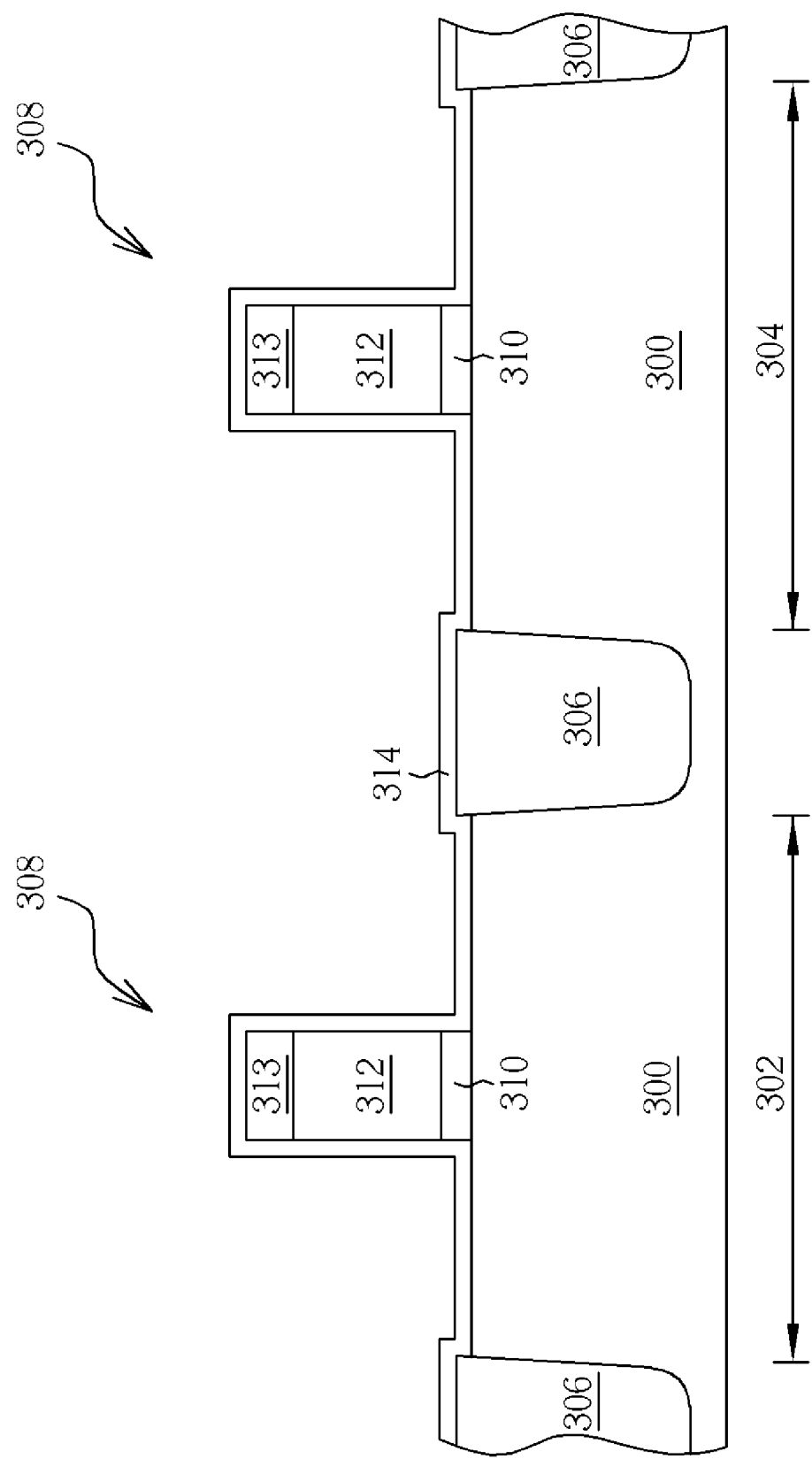
FIG. 7 to FIG. 14 are cross-sectional diagrams, illustrating a fabricating method of MOS transistors in accordance with the second preferred embodiment of the present invention.

Please refer to FIG. 7 to FIG. 14, which are cross-sectional diagrams illustrating a method for fabricating a MOS transistor in accordance with the second preferred embodiment of the present invention. For highlighting the characteristic of the present invention and for clarity of illustration, FIG. 7 to FIG. 14 merely show a first conductive transistor area and a second conductive transistor area. As shown in FIG. 7, a semiconductor substrate 300 is provided such as a silicon substrate or a silicon-on-insulator (SOI) substrate, but not limited thereto. The semiconductor substrate 300 comprises a plurality of first conductive transistor areas 302 and a plurality of second conductive transistor areas 304, and the first conductive transistor areas 302 and the second conductive transistor areas 304 are isolated by isolation structures such as shallow trench isolations (STI) 306. Generally speaking, STI 306 is formed by etching a trench in the semiconductor substrate 300 and then filling the trench with insulating materials such as silicon oxide. Besides, the semiconductor substrate 300 further comprises a plurality of gates 308, positioned respectively on each first conductive transistor area 302 and each second conductive transistor area 304. Each gate 308 comprises a dielectric layer 310, a conductive layer 312 positioned on the dielectric layer 310 and a cap layer 313 positioned on the conductive layer 312. In general, the dielectric layer 310 comprises isolating materials such as silicon oxide components or silicon nitride components, etc; the conductive layer 312 comprises conductive materials such as polysilicon or metal silicide; and the cap layer 213 comprises dielectric materials such as silicon nitride.

Subsequently, a first protective layer 314 is formed on the semiconductor substrate 300, and the first protective layer 314 covers the surface of each gate 308. According to the second preferred embodiment of the present invention, the first protective layer 314 may comprise any materials with an appropriate etching selectivity to the semiconductor substrate 300 and the conductive layer 312: silicon nitride component, for instance, but not limited thereto. Silicon oxide component may also be used, but the effect of using silicon nitride is better. The first protective layer 314 has a thickness of about 150 to 250 Å, and is preferably about 200 Å.

Figure 8:
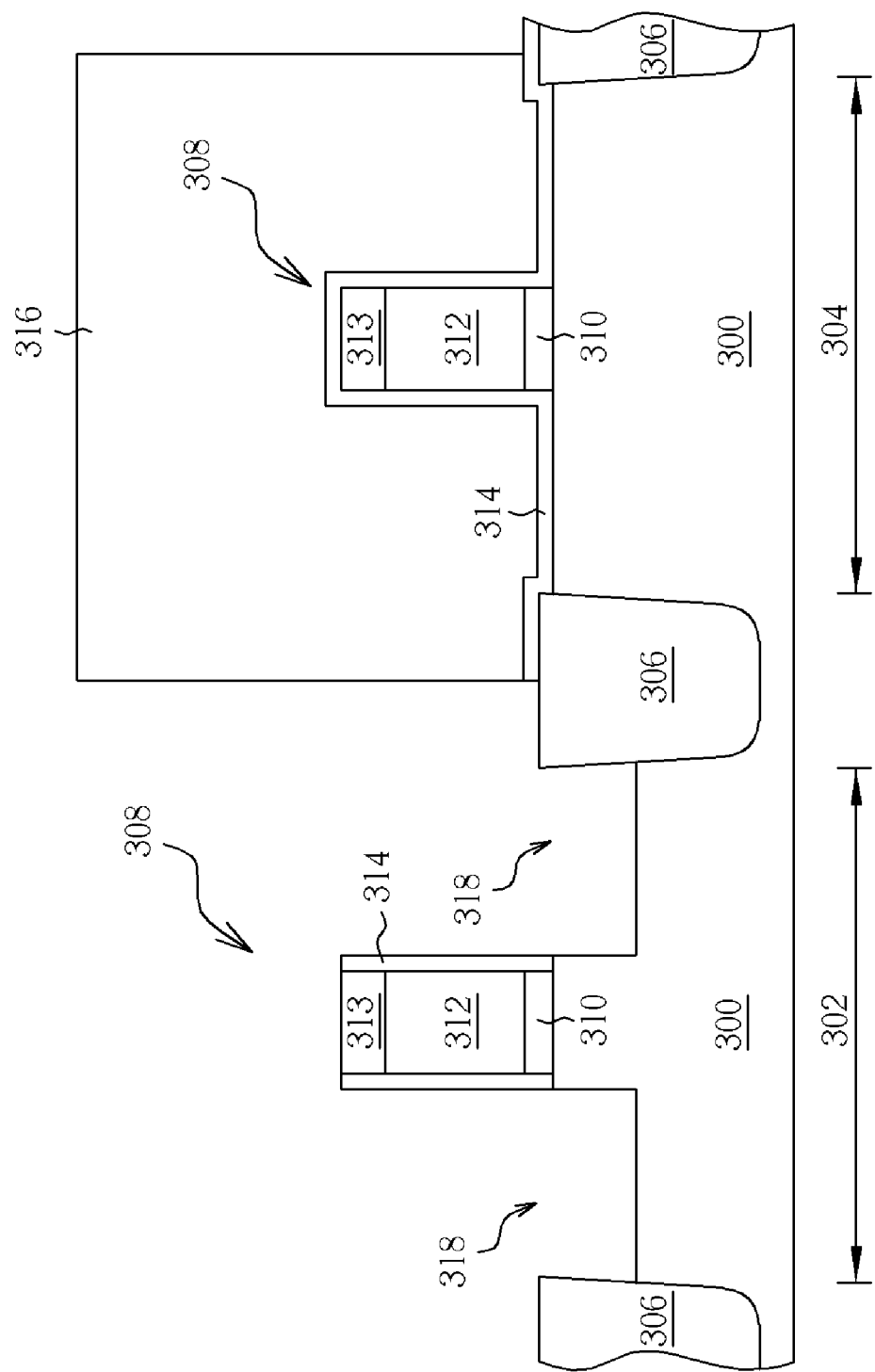

As shown in FIG. 8, a first patterned mask 316 is coated on the second conductive transistor area 304 and a portion of the STI 306. An etching process such as an anisotropic dry etching is carried out to form first recesses 318 in the first conductive transistor area 302. Thereafter, the first patterned mask 316 is removed.

Figure 9:
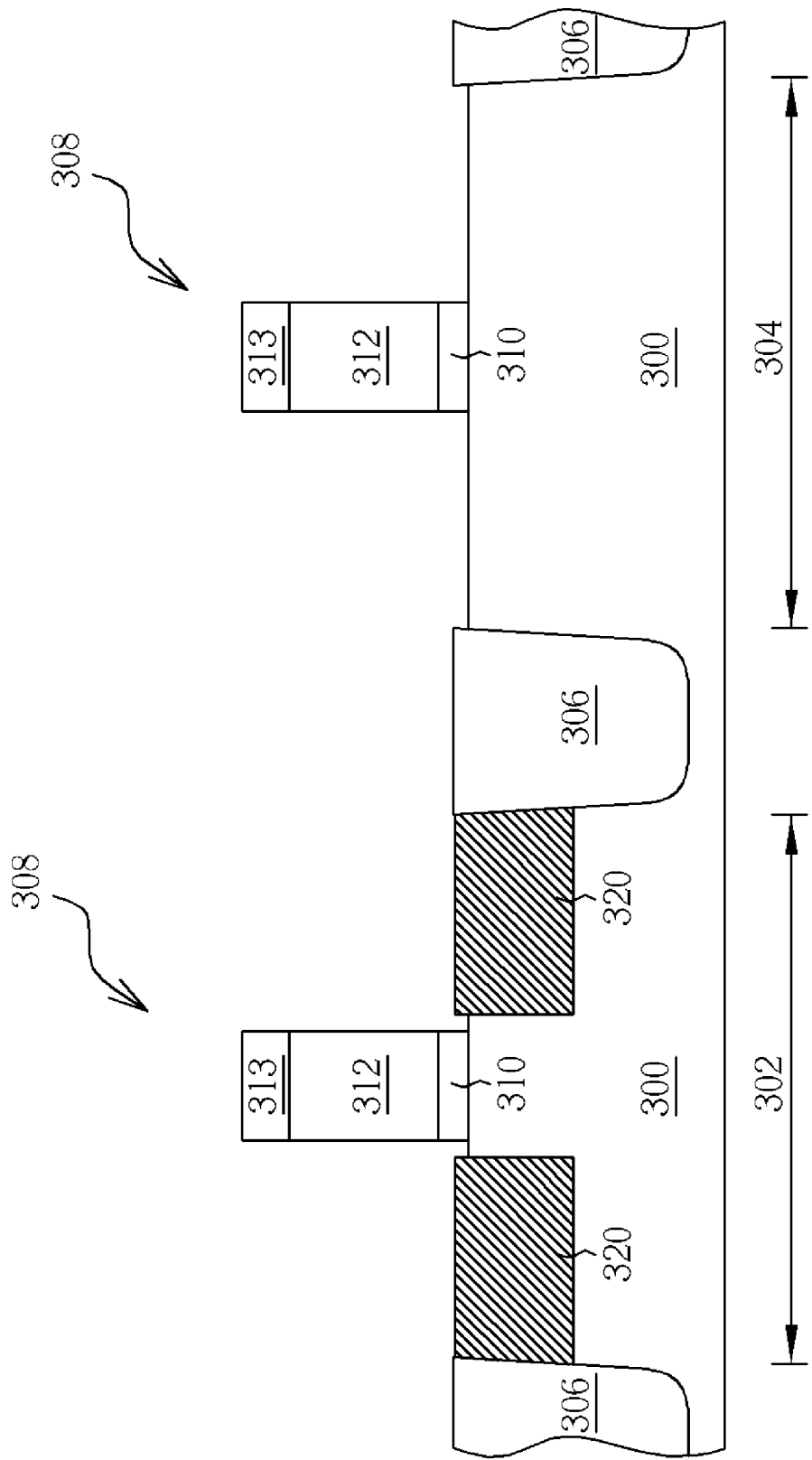

As shown in FIG. 9, after a pre-cleaning step is performed to clean the semiconductor substrate 300 of the first conductive transistor area 302, such as using DHF solution or SPM solution to remove impurities upon the surface of the first recesses 318, an epitaxial growth process is carried out to form first epitaxial layers 320 in the first recesses 318. Then, the first protective layer 314 is removed. The first epitaxial layer 320 is grown in the first recess 318 and it may be grown higher than the surface of the semiconductor substrate 300, so as to form a raised epitaxial layer. Besides, the epitaxial growth process may be an in-situ doped ion epitaxial growth process. According to the second preferred embodiment of the present invention, when the first conductive transistor area 302 is a PMOS transistor area, the first epitaxial layer 320 is composed of SiGe.

Figure 10:
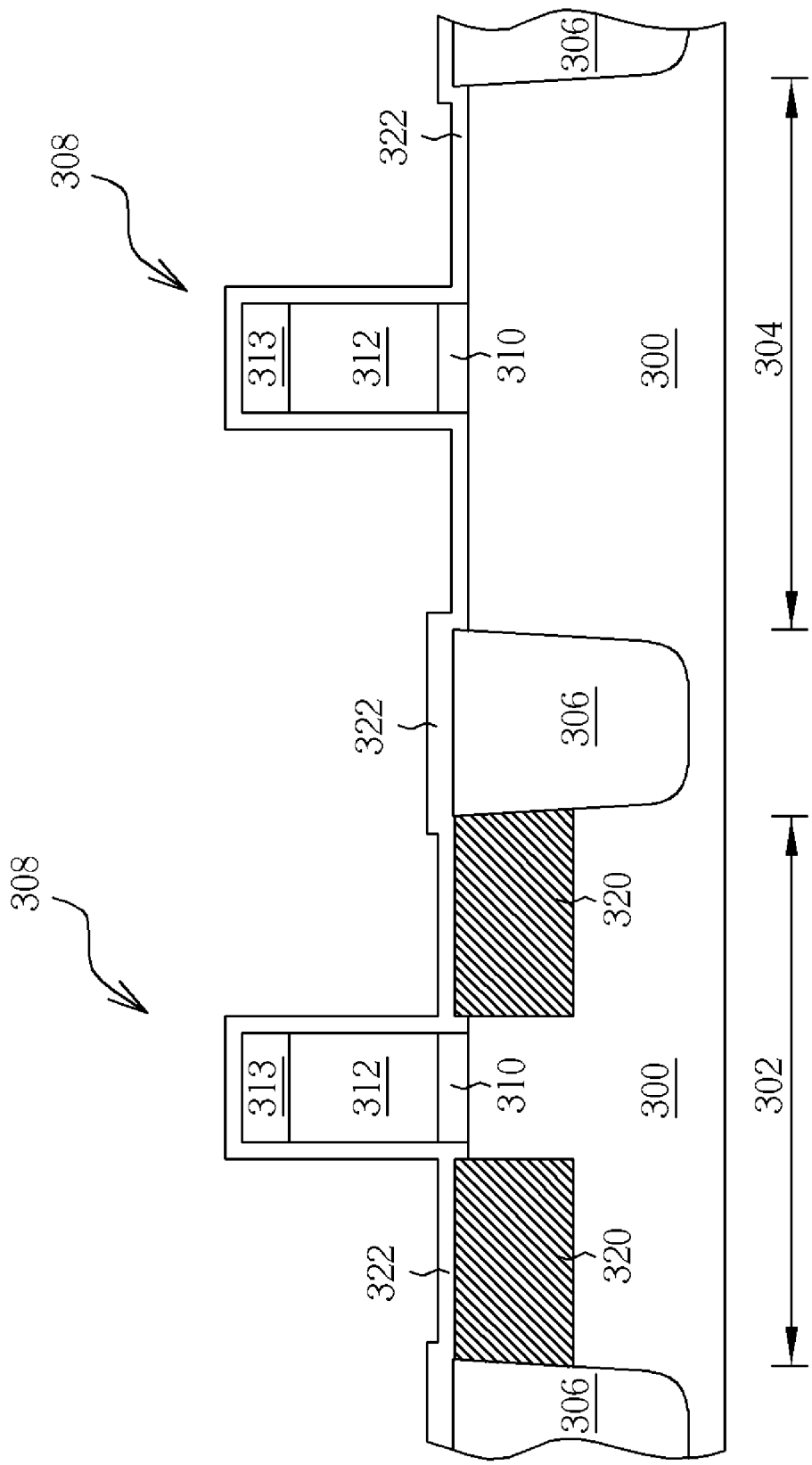

As shown in FIG. 10, a second protective layer 322 is formed on the semiconductor substrate 300 and the second protective layer 322 covers the surface of each gate 308. According to the second preferred embodiment of the present invention, the second protective layer 322 may comprise any materials with an appropriate etching selectivity to the semiconductor substrate 300 and the conductive layer 312: silicon nitride component, for instance, but not limited thereto. Silicon oxide component may also be used, but the effect of using silicon nitride is better. The second protective layer 322 has a thickness of about 150 to 250 Å, and is preferably about 200 Å.

Figure 11:
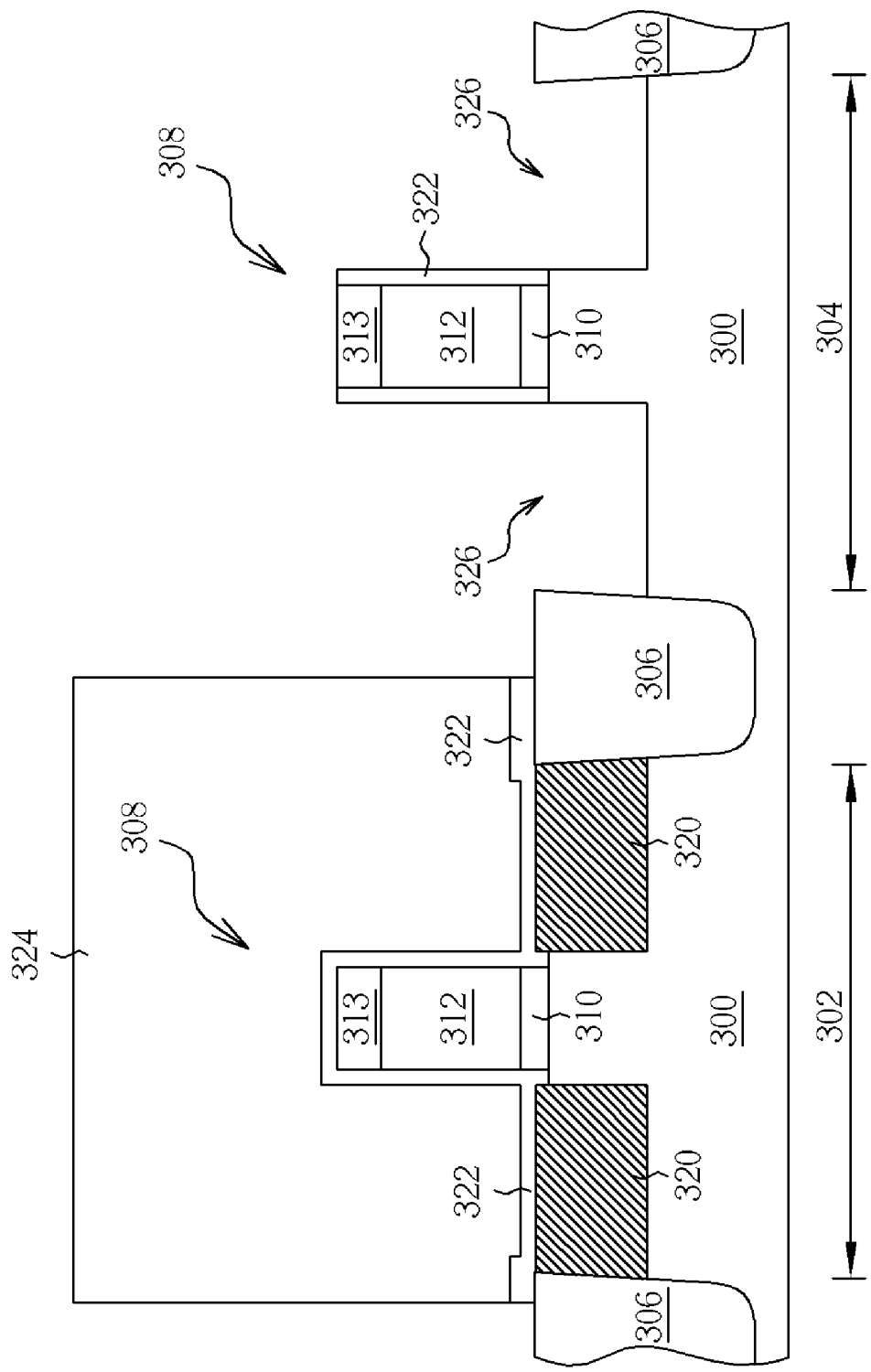

As shown in FIG. 11, a second patterned mask 324 is coated on the first conductive transistor area 302 and a portion of the STI 306. An etching process such as an anisotropic dry etching is carried out to form second recesses 326 in the second conductive transistor area 304. Thereafter, the second patterned mask 324 is removed.

It should be noticed that the steps of forming the second recess 326 shown in FIG. 10 to FIG. 11 might be performed without using the second protective layer 322. Namely, after forming the first epitaxial layer 320 as shown in FIG. 9, the first protective layer 314 is not removed and then the second patterned mask 324 is coated directly on the first conductive transistor area 302 and a portion of the STI 306. Subsequently, an etching process such as that shown in FIG. 11 is carried out to form the second recesses 326 in the second conductive transistor area 304. Thereafter, the second patterned mask 324 and the first protective layer 314 are removed. Those skilled in the art will readily observe that numerous modifications and alterations of the method may be made while retaining the teachings of the invention.

Figure 12:
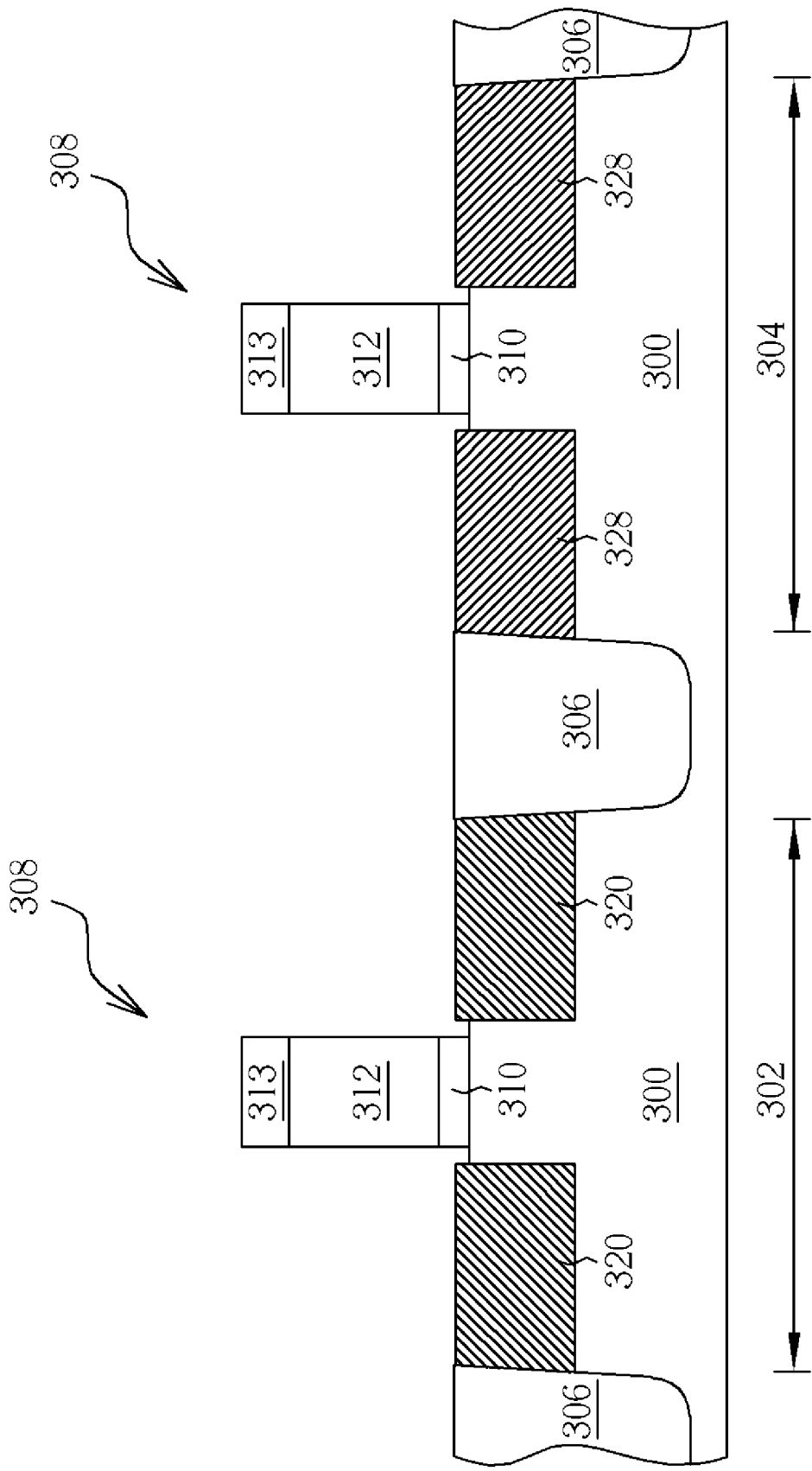

As shown in FIG. 12, after a pre-cleaning step is performed to clean the semiconductor substrate 300 of the second conductive transistor area 304, such as using DHF solution or SPM solution to remove impurities upon the surface of the second recesses 326, an epitaxial growth process is carried out to form second epitaxial layers 328 in the second recesses 326. Then, the second protective layer 322 is removed. The second epitaxial layer 328 is grown in the second recess 326 and it may be grown higher than the surface of the semiconductor substrate 300, so as to form a raised epitaxial layer. Besides, the epitaxial growth process may be an in-situ doped ion epitaxial growth process. According to the second preferred embodiment of the present invention, when the second conductive transistor area 304 is an NMOS transistor area, the second epitaxial layer 328 is composed of SiC. It should be noticed that the process of forming the first epitaxial layer 320 as shown in FIG. 7 to FIG. 9 might be performed after the process of forming the second epitaxial layer 328 as shown in FIG. 10 to FIG. 12. Those skilled in the art will readily observe that numerous modifications and alterations of the method may be made while retaining the teachings of the invention.

Figure 13:
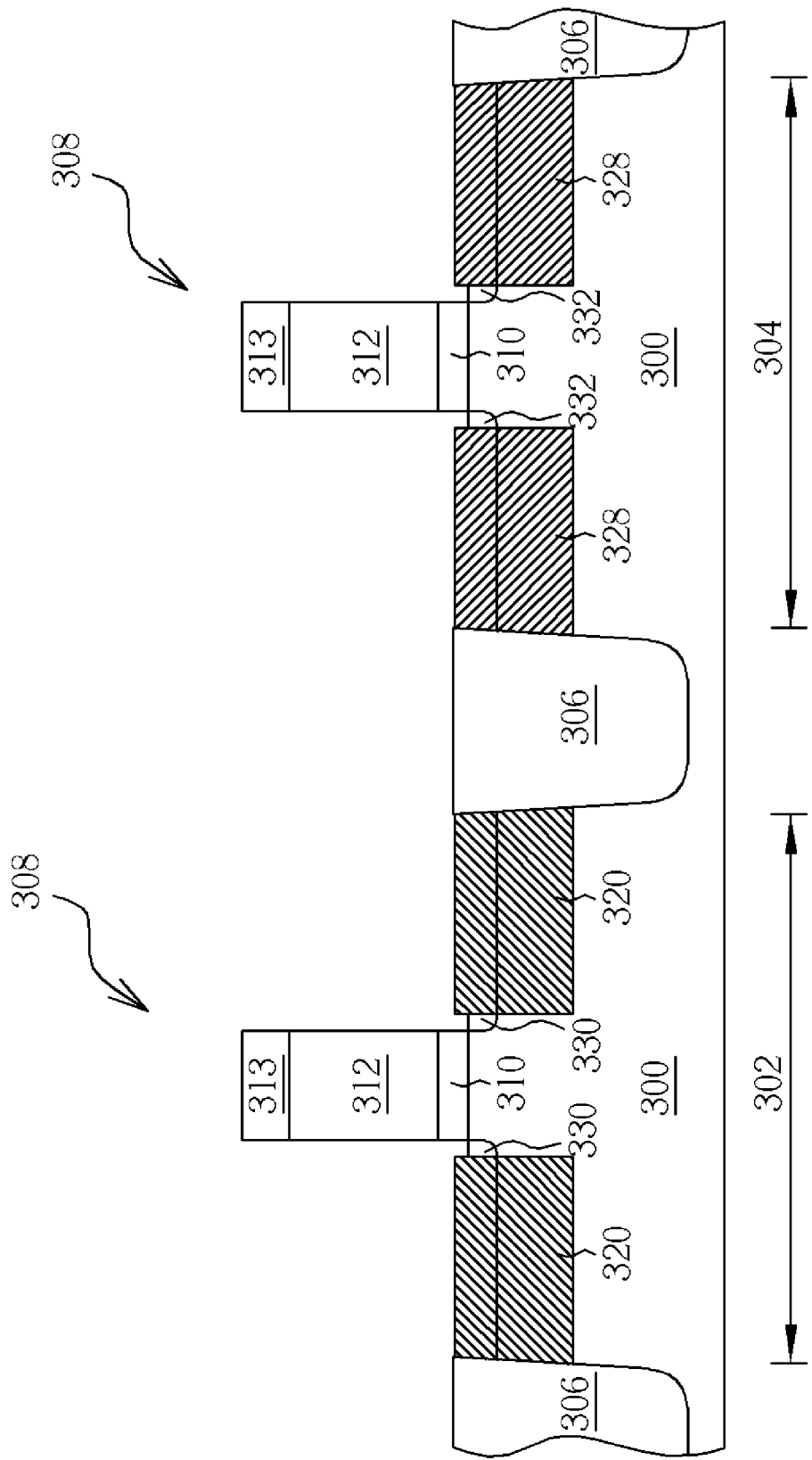

As shown in FIG. 13, a patterned mask (not shown) is coated on the second conductive transistor area 304. A first ion lightly doped process is carried out to form a first ion lightly doped region 330 in the first conductive transistor area 302. Then the patterned mask is removed. Thereafter, another patterned mask (not shown) is coated on the first conductive transistor area 302. A second ion lightly doped process is then carried out to form a second ion lightly doped region 332 in the second conductive transistor area 304. Then the patterned mask is removed.

Figure 14:
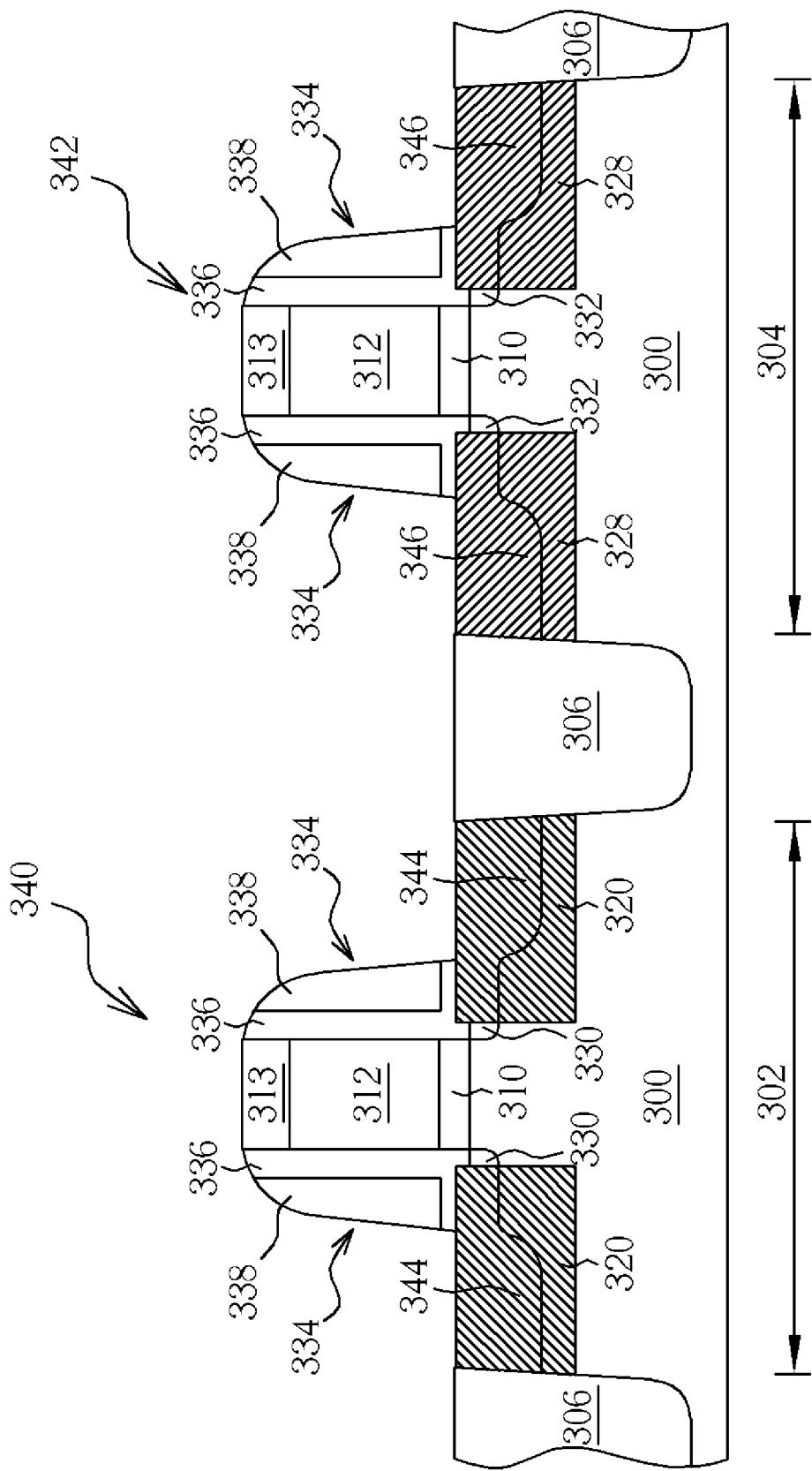

As shown in FIG. 14, spacers 334 are formed on the sidewalls of each gate 308. According to the second preferred embodiment of the present invention, each spacer 334 comprises an oxide liner 336 and a nitride spacer 338. The spacers 334 cover the sidewalls of each gate 308 and extend laterally onto the first ion lightly doped region 330 and the second ion lightly doped region 332. The spacers 334 also cover a portion of the first epitaxial layer 320 and a portion of the second epitaxial layer 328. Additionally, each spacer 334 may further comprise an offset spacer (not shown) positioned between the gate 308 and the oxide liner 336.

Finally, a patterned mask (not shown) is coated on the second conductive transistor area 304. A first ion source/drain implantation process is then carried out to form a first ion source/drain region 344 in the first conductive transistor area 302; thereby a first conductive transistor 340 such as a PMOS transistor is formed in the first conductive transistor area 302. Thereafter, the patterned mask is removed. Subsequently, another patterned mask (not shown) is coated on the first conductive transistor area 302. A second ion source/drain implantation process is carried out to form a second ion source/drain region 346 in the second conductive transistor area 304; thereby a second conductive transistor 342 such as an NMOS transistor is formed in the second conductive transistor area 304. Thereafter, the patterned mask is removed.

It should be noticed that the processes of forming the first source/drain regions 334 and the second source/drain regions 346 as shown in FIG. 14 is an optional step depending on the method used in the epitaxial growth process. Because the epitaxial growth process as shown in FIG. 9 may be an in-situ doped epitaxial growth process, therefore, while the first epitaxial layer 320 or the second epitaxial layer 328 is formed, the demanded doped ions can also be implanted into the semiconductor substrate 300 or the grown epitaxial layers 320, 328, as a result, the corresponding source/drain regions are formed. Accordingly, source/drain implantation as shown in FIG. 14 can be skipped.

Since the characteristic of the present invention is to form the epitaxial layer before forming the spacer, thus the distance between the gate and the epitaxial layer is no longer limited by the width of the spacer. Besides, the process of etching the recess is carried out before forming the spacer. At this moment, the pattern density on the semiconductor substrate is lower than the time when the spacer is formed, thus the micro-loading effect caused by the pattern density can be reduced, and then the uniformity in etching the recess is increased. Additionally, the lightly doped regions and the source/drain regions are doped after forming the epitaxial layer, thus the doped ions will not be affected by the high temperature epitaxial growth process, which leads the doped ions to diffuse. Finally, since the present invention provides a protective layer to cover the semiconductor substrate and the shallow trench isolation (STI), the problem of the STI thickness loss will be reduced.

Those skilled in the art will readily observe that numerous modifications and alterations of the device and method may be made while retaining the teachings of the invention.

What is claimed is:

1. A MOS transistor structure, comprising:
   a gate formed on a semiconductor substrate;
   two raised epitaxial layers positioned respectively in the semiconductor substrate next to the relative sides of the gate and above the surface of the semiconductor substrate;
   a spacer formed on the sidewall of the gate and extending laterally upon a portion of the raised epitaxial layers, and a contact surface of the raised epitaxial layers and a bottom of the spacer is above the surface of the semiconductor substrate; and
   two doped region formed respectively in the semiconductor substrate next to the relative sides of the gate.

2. The structure of claim 1, wherein the gate further comprises:
   a dielectric layer;
   a conductive layer, positioned on the dielectric layer; and
   a cap layer, positioned on the conductive layer.

3. The structure of claim 1, wherein the MOS transistor comprises a PMOS transistor.

4. The structure of claim 3, wherein the epitaxial layer comprises SiGe.

5. The structure of claim 1, wherein the MOS transistor comprises an NMOS transistor.

6. The structure of claim 5, wherein the epitaxial layer comprises SiC.

7. The structure of claim 1, wherein the spacer further comprises an offset spacer, positioned between the gate and the spacer.

8. The structure of claim 1, wherein the spacer further comprises an oxide liner and a nitride spacer.

9. The structure of claim 1, wherein the edge of the raised epitaxial layers is not aligned with the edge of the spacer.

10. The structure of claim 1, wherein the spacer further comprises a L-shaped spacer.

11. The structure of claim 1, further comprising a lightly doped drain disposed in the semiconductor substrate and outside the raised epitaxial layers.

* * * * *